(12) United States Patent
Suzaki et al.

(10) Patent No.: US 7,955,991 B2
(45) Date of Patent: Jun. 7, 2011

(54) PRODUCING METHOD OF A SEMICONDUCTOR DEVICE USING CVD PROCESSING

(75) Inventors: Kenichi Suzaki, Toyama (JP); Jie Wang, Toyama (JP)

(73) Assignee: Hitachi Kokussai Electric Inc., Tokyo (JP)

( * ) Notice: Subject to any disclaimer, the term of this patent is extended or adjusted under 35 U.S.C. 154(b) by 771 days.

(21) Appl. No.: 10/572,396

(22) PCT Filed: Sep. 17, 2004

(86) PCT No.: PCT/JP2004/013678
§ 371 (c)(1),
(2), (4) Date: Jun. 6, 2007

(87) PCT Pub. No.: WO2005/029566
PCT Pub. Date: Mar. 31, 2005

(65) Prior Publication Data
US 2007/0259532 A1     Nov. 8, 2007

(30) Foreign Application Priority Data
Sep. 19, 2003   (JP) ................................. 2003-327358

(51) Int. Cl.
*C23C 16/455*       (2006.01)
*C23C 16/00*        (2006.01)
(52) U.S. Cl. ........ 438/765; 438/758; 438/778; 438/905; 257/E21.17; 118/719; 118/724; 204/298.23; 204/298.25; 427/255.28; 427/588; 134/1.3
(58) Field of Classification Search .................. 438/680, 438/905, 913, 38, 296, 396, 585, 643, 653, 438/655, 682, 685, 720, 773, 775, 791, 794, 758, 765, 778; 118/718–719, 724–725; 156/345.31–345.33, 345.37; 204/298.23–298.26; 414/935–941; 427/248.1; 134/1.1–1.3; 34/280, 292, 293; 257/E21.17
See application file for complete search history.

(56) References Cited

U.S. PATENT DOCUMENTS

| | | | | | |
|---|---|---|---|---|---|
| 4,067,727 | A | * | 1/1978 | Cappel | ............................. 75/757 |
| 4,745,088 | A | * | 5/1988 | Inoue et al. | ...................... 117/98 |
| 5,271,162 | A | * | 12/1993 | Kunz et al. | ....................... 34/493 |

(Continued)

FOREIGN PATENT DOCUMENTS

JP       63-181313        7/1988

(Continued)

OTHER PUBLICATIONS

Office Action dated Jun. 1, 2010 for Japanese Application No. 2005-514067.

*Primary Examiner* — Matthew C Landau
*Assistant Examiner* — Maliheh Malek
(74) *Attorney, Agent, or Firm* — Birch, Stewart, Kolasch & Birch, LLP

(57) ABSTRACT

Disclosed is a producing method of a semiconductor device, comprising: loading a substrate into a reaction furnace; forming a film on the substrate in the reaction furnace; unloading the substrate from the reaction furnace after the film has been formed; and forcibly cooling an interior of the reaction furnace in a state where the substrate does not exist in the reaction furnace after the substrate has been unloaded.

17 Claims, 5 Drawing Sheets

U.S. PATENT DOCUMENTS

| | | | |
|---|---|---|---|
| 5,295,668 A * | 3/1994 | Ohmi et al. | 266/252 |
| 5,447,294 A * | 9/1995 | Sakata et al. | 266/257 |
| 5,637,153 A * | 6/1997 | Niino et al. | 134/22.11 |
| 5,750,436 A * | 5/1998 | Yamaga et al. | 438/558 |
| 5,963,834 A * | 10/1999 | Hatano et al. | 438/680 |
| 6,171,104 B1 * | 1/2001 | Saito et al. | 432/18 |
| 6,368,405 B1 | 4/2002 | Shin | |
| 6,537,926 B1 * | 3/2003 | Schrems et al. | 438/770 |
| 6,573,178 B1 * | 6/2003 | Nakamura | 438/643 |
| 6,720,274 B2 * | 4/2004 | Ozaki et al. | 438/758 |
| 6,790,793 B2 * | 9/2004 | Nishino et al. | 438/791 |
| 6,905,972 B2 * | 6/2005 | Oda | 438/716 |
| 7,094,708 B2 * | 8/2006 | Kato et al. | 438/778 |
| 7,156,923 B2 * | 1/2007 | Kato et al. | 118/715 |
| 7,311,888 B2 * | 12/2007 | Takeno et al. | 423/328.2 |
| 7,416,978 B2 * | 8/2008 | Hasebe et al. | 438/680 |
| 7,494,941 B2 * | 2/2009 | Kasahara et al. | 438/792 |
| 7,556,839 B2 * | 7/2009 | Noda et al. | 427/248.1 |
| 7,731,797 B2 * | 6/2010 | Nakashima et al. | 118/715 |
| 7,737,034 B2 * | 6/2010 | Ozaki et al. | 438/680 |
| 2001/0034090 A1 * | 10/2001 | Joo | 438/197 |
| 2002/0132497 A1 * | 9/2002 | Tometsuka | 438/782 |
| 2002/0168854 A1 * | 11/2002 | Tometsuka | 438/680 |
| 2003/0092283 A1 * | 5/2003 | Ozaki et al. | 438/758 |
| 2003/0136517 A1 * | 7/2003 | Hori et al. | 156/345.37 |
| 2003/0153180 A1 * | 8/2003 | Marunaka et al. | 438/680 |
| 2003/0224615 A1 * | 12/2003 | Nishino et al. | 438/758 |
| 2005/0090123 A1 * | 4/2005 | Nishimura et al. | 438/800 |
| 2006/0205213 A1 * | 9/2006 | Ozaki et al. | 438/680 |
| 2007/0032045 A1 * | 2/2007 | Kasahara et al. | 438/478 |
| 2008/0090389 A1 * | 4/2008 | Wang et al. | 438/503 |
| 2008/0134977 A1 * | 6/2008 | Nakashima et al. | 118/729 |
| 2008/0227251 A1 * | 9/2008 | Yamamoto et al. | 438/239 |
| 2008/0268644 A1 * | 10/2008 | Kameda et al. | 438/694 |
| 2009/0114155 A1 * | 5/2009 | Sawayama et al. | 118/724 |
| 2009/0149032 A1 * | 6/2009 | Kameda et al. | 438/778 |
| 2009/0163037 A1 * | 6/2009 | Miya et al. | 438/778 |
| 2009/0170328 A1 * | 7/2009 | Kameda et al. | 438/694 |
| 2009/0181547 A1 * | 7/2009 | Okuda et al. | 438/758 |
| 2009/0205567 A1 * | 8/2009 | Noda et al. | 118/668 |
| 2009/0239386 A1 * | 9/2009 | Suzaki et al. | 438/758 |
| 2010/0201055 A1 * | 8/2010 | Ozaki et al. | 269/289 R |
| 2010/0317174 A1 * | 12/2010 | Noda et al. | 438/478 |

FOREIGN PATENT DOCUMENTS

| | | |
|---|---|---|
| JP | 63-181313 A | 7/1988 |
| JP | 1-243515 | 9/1989 |
| JP | 1-243515 A | 9/1989 |
| JP | 5-47681 | 2/1993 |
| JP | 5-47681 A | 2/1993 |
| JP | 7-263370 | 10/1995 |
| JP | 7-263370 A | 10/1995 |
| JP | 10-280153 A | 10/1998 |
| JP | 2000-150496 A | 5/2000 |
| JP | 2000-306904 | 11/2000 |
| JP | 2000-306904 A | 11/2000 |
| JP | 2001-126998 A | 5/2001 |
| JP | 2001-140054 A | 5/2001 |
| JP | 2002-212730 | 7/2002 |
| JP | 2002-212730 A | 7/2002 |
| JP | 2002-305189 A | 10/2002 |
| JP | 2002-317269 | 10/2002 |
| JP | 2002-317269 A | 10/2002 |
| JP | 2003-158080 | 5/2003 |
| JP | 2003-158080 A | 5/2003 |
| JP | 2003-203868 | 7/2003 |
| JP | 2003-203868 A | 7/2003 |
| KR | 2000-0041947 A | 7/2000 |
| KR | 2001-0014786 A | 2/2001 |
| KR | 2003-0030769 A | 4/2003 |

* cited by examiner

PRODUCING METHOD OF A SEMICONDUCTOR DEVICE USING CVD PROCESSING

TECHNICAL FIELD

The present invention relates to a producing method of a semiconductor device and a substrate processing apparatus, and more particularly, to a producing method of a semiconductor device and a substrate processing apparatus which use CVD (Chemical Vapor Deposition) processing for reducing fine particles generated in a producing process.

BACKGROUND ART

In a process for producing a semiconductor device, a film is formed on a substrate to be processed such as a wafer using chemical vapor deposition (CVD) method.

The film is formed in the following manner. That is, a predetermined number of wafers are mounted on a boat. The wafers mounted on the boat are loaded into a reaction furnace. The reaction furnace is evacuated, reaction gas is introduced into the reaction furnace, and films are formed on the wafers.

After the film formation is completed, the pressure in the reaction furnace is returned to the atmospheric pressure, and the boat is unloaded. The boat is cooled in a state in which the boat is completed pulled out from the furnace. At the same time, the temperature in the reaction furnace is lowered, and gas purging (decompression $N_2$ purging) is carried out. With the gas purging, stress of deposited film adhered to an inner wall of the reaction furnace is increased to allow a cracking to produce in the deposited film, and fine particles generated when the cracking is produced is eliminated by the gas purging (see Japanese Patent Application Laid-open Publication No. 2000-306904).

DISCLOSURE OF THE INVENTION

In this case, when the temperature in the furnace is lowered in a state where the processed substrates are unloaded from the reaction furnace, the temperature in the furnace is lowered from the film forming temperature to about 150° C. over several tens of minutes, e.g., 50 minutes at natural air cooling temperature lowering rate ($\approx 3°$ C./min). However, with the temperature lowering rate of about 3° C./min, the particle discharging effect obtained by forcibly generating a cracking in the deposited film (film cracking generated when thermal stress caused by difference of coefficient of thermal expansion between the deposited film and a quartz reaction tube exceeds a tolerance limit value (mechanical disruptive strength of the deposited film)) is low. Especially in processing of φ300 mm wafer, it is found that a large number of particles are generated when the accumulated film thickness exceeds 1.2 μm and in the processing of φ300 mm wafer, the particle reducing effect is extremely low. Further, since about 50 minutes are required for reducing the temperature ($\approx 3°$ C./min) by natural air cooling, there is a problem that availability rate of the substrate processing apparatus (semiconductor producing apparatus) is lowered and the productivity is deteriorated.

It is a main object of the present invention to provide a producing method of a semiconductor device and a substrate processing apparatus having excellent particle reducing effect and capable of enhancing the productivity.

According to an aspect of the present invention, there is provided a producing method of a semiconductor device, comprising:

loading a substrate into a reaction furnace;
forming a film on the substrate in the reaction furnace;
unloading the substrate from the reaction furnace after the film has been formed; and
forcibly cooling an interior of the reaction furnace in a state where the substrate does not exist in the reaction furnace after the substrate has been unloaded.

According to another aspect of the present invention, there is provided a producing method of a semiconductor device, comprising:

loading a substrate into a reaction furnace;
forming a film on the substrate in the reaction furnace;
unloading the substrate from the reaction furnace after the film has been formed; and
after the substrate has been unloaded and in a state where the substrate does not exist in the reaction furnace, lowering a temperature of the interior of the reaction furnace to a temperature lower than a film forming temperature simultaneously with gas-purging the furnace in a state where a pressure in the furnace is equal to the atmospheric pressure.

According to still another aspect of the present invention, there is provided a producing method of a semiconductor device, comprising:

loading a substrate into a reaction furnace;
forming a film on the substrate in the reaction furnace;
unloading the substrate from the reaction furnace after the film has been formed; and
after the substrate has been unloaded and in a state where the substrate does not exist in the reaction furnace, lowering a temperature of the interior of the reaction furnace to a temperature lower than a film forming temperature, simultaneously with supplying gas into the furnace and exhausting the furnace using an exhaust line which is different from an exhaust line used in the film forming step.

According to still another aspect of the present invention, there is provided a producing method of a semiconductor device, comprising:

loading a substrate into a reaction furnace;
forming a film on the substrate in the reaction furnace;
unloading the substrate from the reaction furnace after the film has been formed; and
after the substrate has been unloaded and in a state where the substrate does not exist in the reaction furnace, once increasing a temperature of the interior of the furnace to a temperature higher than a film forming temperature and thereafter lowering the temperature of the interior of the reaction furnace to a temperature lower than a film forming temperature.

According to still another aspect of the present invention, there is provided a substrate processing apparatus, comprising:

a reaction furnace for forming a film on a substrate;
a film-forming gas supply line through which a film-forming gas is supplied into the reaction furnace;
a purge gas supply line through which purge gas is supplied into the reaction furnace;
an exhaust line through which the reaction furnace is exhausted;
a transfer device which loads and unloads the substrate to and from the reaction furnace;
a forcibly cooling device which forcibly cools an interior of the reaction furnace, and
a controller which controls the forcibly cooling device to forcibly cool the interior of the reaction furnace in a state where the substrate does not exist in the reaction furnace after the substrate is unloaded from the reaction furnace.

BRIEF DESCRIPTION OF THE FIGURES IN THE DRAWINGS

PREFERABLE MODE FOR CARRYING OUT THE INVENTION

In a preferred embodiment, in a state where a substrate is taken out from the reaction furnace, an interior of the reaction furnace is abruptly cooled by a heater having a quick cooling mechanism at a temperature lowering rate of 10° C./min or more, preferably 20° C./min or more, thereby forcibly generating a cracking in a deposited film formed in the reaction furnace, fine particles generated when the cracking is generated is forcibly discharged by atmospheric pressure gas purge, fine particles adhering to a wafer are reduced, the cleaning frequency of the reaction furnace is reduced, and productivity is enhanced.

A preferable embodiment of the present invention will be explained with reference to the drawings. A semiconductor producing apparatus as a substrate processing apparatus which carries out CVD film forming processing of the preferred embodiment will be explained with reference to FIG. 2. The semiconductor producing apparatus shown in FIGS. 1 and 2 is a hot wall type batch processing type vertical semiconductor producing apparatus.

Figure 1:
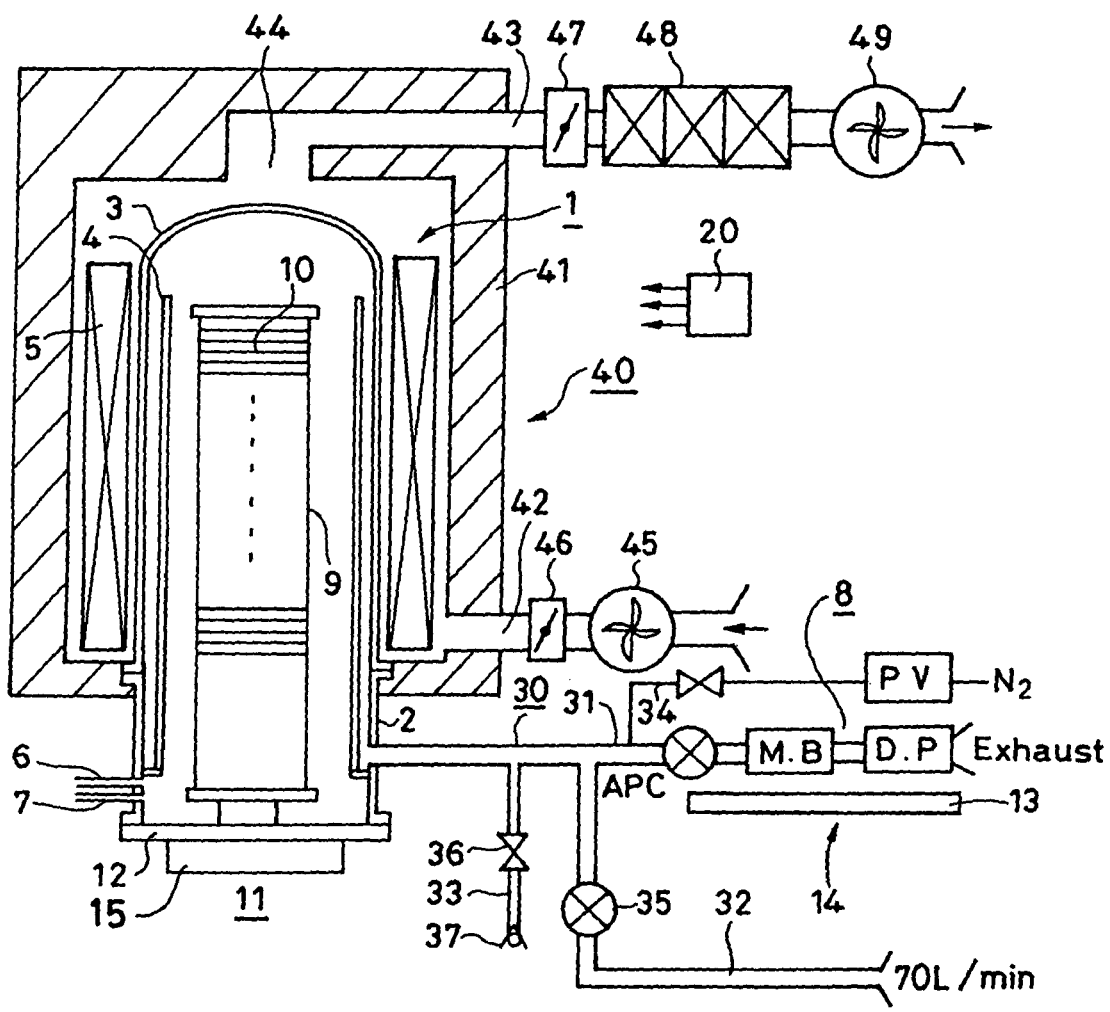
FIG. 1 is a schematic longitudinal sectional view for explaining a substrate processing apparatus according to a preferable embodiment of the present invention.
Figure 2:
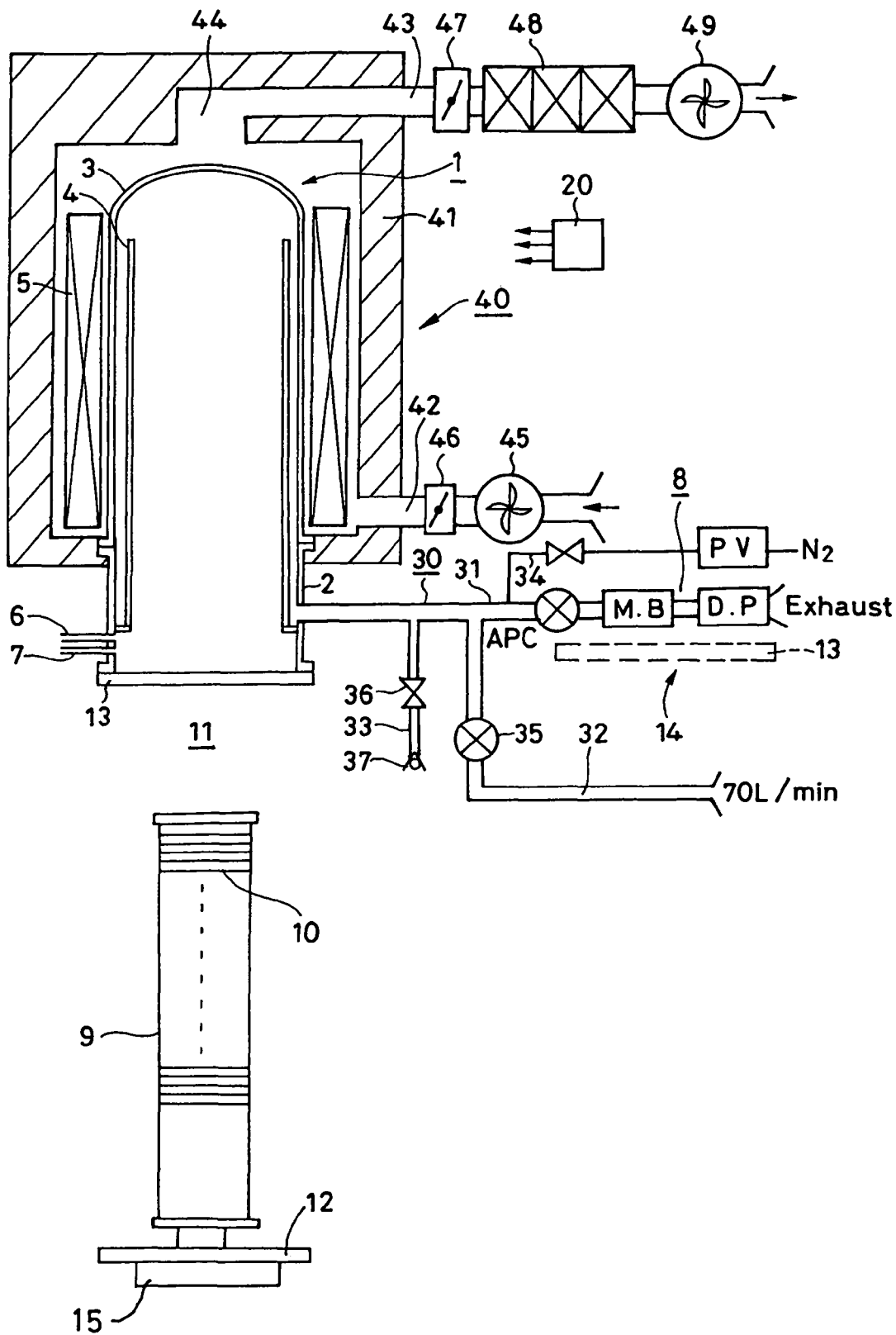
FIG. 2 is a schematic longitudinal sectional view for explaining a substrate processing apparatus according to a preferable embodiment of the present invention.

FIG. 1 shows a state where a boat 9 on which the wafers 10 are mounted is loaded into the reaction furnace 1, and a lower opening of a furnace opening flange 2 is closed with a furnace opening seal cap 12. FIG. 2 shows a state where the boat 9 on which the wafers 10 are mounted is unloaded from the reaction furnace 1 into a transfer chamber 11, and the lower opening of the furnace opening flange 2 is closed with a furnace opening gate valve 13.

The reaction furnace 1 of a hot wall type, and includes the metal furnace opening flange 2, a quartz outer tube 3 which air-tightly stands on the furnace opening flange 2, a quartz inner tube 4 which stands concentrically within the quartz outer tube 3, and a heater 5 provided outside of the quartz outer tube 3 such as to surround the quartz outer tube 3.

A forcibly cooling mechanism 40 is provided such as to cover the quartz outer tube 3 and the heater 5. The forcibly cooling mechanism 40 includes a thermal insulation cover 41 covering the quartz outer tube 3 and the heater 5, a supply line 42 which is in communication with an interior space of the thermal insulation cover 41, and an exhaust line 43 which is in communication with the interior space of the thermal insulation cover 41 through an exhaust hole 44 formed in a ceiling of the thermal insulation cover 41. The supply line 42 is provided with a shutter 47, a radiator 48 and an exhaust blower 49.

Gas introducing line 6 and 7 are in communication with an interior of the reaction furnace 1 for introducing reaction gas, and an exhaust line 30 is also in communication with the interior of the reaction furnace 1. The gas introducing line 6 and 7 are connected to the furnace opening flange 2 at a location lower than a lower end of the quartz inner tube 4. The exhaust line 30 is connected to the furnace opening flange 2 at a location lower than a lower end of the quartz outer tube 3 and upper than the lower end of the quartz inner tube 4. The exhaust line 30 includes a main exhaust line 31 which is in communication with an exhaust apparatus 8 such as a vacuum pump, a HFV (high flow vent) line 3 which is branched off from the main exhaust line 31, a slow exhaust line (now shown) which is branched off from the main exhaust line 31, and an overpressure preventing line 33 and a nitrogen gas introducing line 34 which are branched off from the main exhaust line 31. An APC valve as a main valve is provided on the main exhaust line 31 downstream from the branch point of the flow vent line 32. A slow exhaust line is provided such as to bypass the APC valve.

The high flow vent line 32 is in communication with an exhaust system of a building service. Exhaust flow rate of the high flow vent line 32 is greater than those of the main exhaust line 31, the slow exhaust line (not shown) and the overpressure preventing line 33, and gas of high flow rate can flow through the high flow vent line 32 at atmospheric pressure. An inner diameter of the high flow vent line 32 is smaller than that of the main exhaust line 31, and is greater than those of the slow exhaust line (not shown) and the overpressure preventing line 33. The high flow vent line 32 includes a valve 35. By switching between the valve 35 and the APC valve, the exhaust route can be switched between the main exhaust line 31 and the high flow vent line 32.

The overpressure preventing line 33 includes a valve 36 and a check valve 37. If the pressure in the main exhaust line 31, i.e., in the reaction furnace 1 becomes equal to or higher than the atmospheric pressure, the check valve 37 is opened, atmosphere in the main exhaust line 31 is exhausted through the check valve 37. Therefore, the pressure in the main exhaust line 31, i.e., in the reaction furnace 1 is prevented from becoming overpressure higher than the atmospheric pressure.

A boat elevator 15 as boat transfer (vertically moving) means is provided in a substrate transfer chamber 11 below the reaction furnace 1. The boat is moved upward and downward to load and unload the boat 9 into and out from the reaction furnace 1. The wafers 10 which are substrates to be processed are mounted in a multi-stacked manner at distances from one another in a horizontal attitude. The boat 9 may be made of quartz.

As shown in FIG. 1, in a state where the boat 9 is loaded into the reaction furnace 1 and the lower opening of the furnace opening flange 2 is closed with the furnace opening seal cap 12, the furnace opening gate valve 13 is in a standby status at a standby position 14. When the boat 9 is unloaded into the transfer chamber 11 from the reaction furnace 1 as shown in FIG. 2, the lower opening of the furnace opening flange 2 is closed with the furnace opening gate valve 13.

A control apparatus 20 controls heating operation of the heater 5, cooling operation of the forcibly cooling apparatus 40, introducing operation of gas of the gas introducing line 6 and 7, selecting operation of the exhaust line by switching between the valves, and exhausting operation of the exhaust line.

Figure 3:
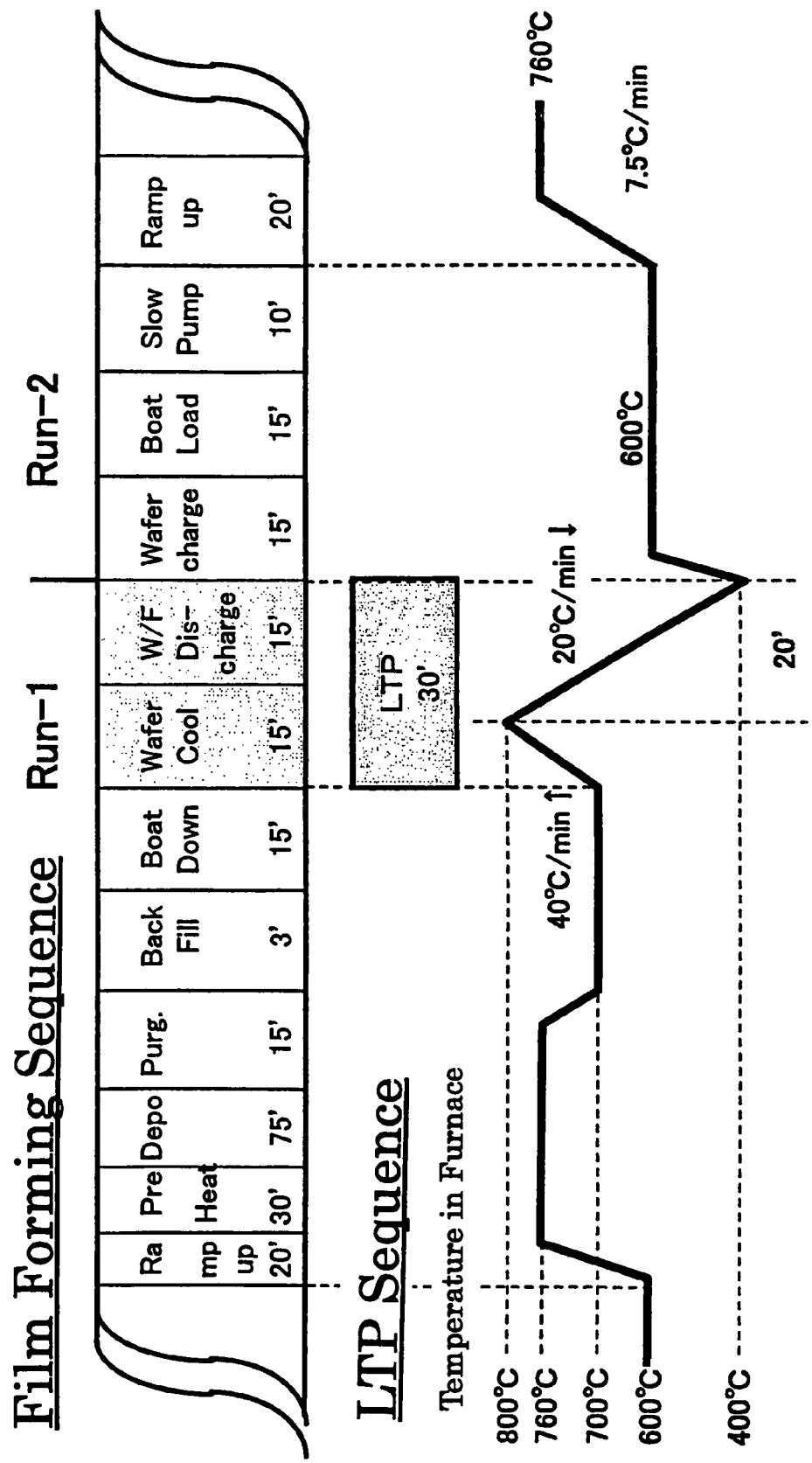
FIG. 3 is a diagram showing a wafer processing flow according to a preferable embodiment of the present invention.

A method for forming films on semiconductor silicon wafers using CVD as one process of a producing step of semiconductor devices using the apparatus will be explained with reference to FIGS. 1 to 3. In the following explanation, operations of various members constituting the apparatus are controlled by the control apparatus 20.

As described above, the substrate transfer chamber 11 exists below the reaction furnace 1, and in a state where the boat 9 is lowered into the substrate transfer chamber 11, a predetermined number of wafers 10 are charged into the boat 9 (Wafer Charge) by a substrate transfer device (not shown). In this state, atmosphere in the reaction furnace 1 is maintained under the atmospheric pressure, and when the wafers 10 are charged into the boat 9, inert gas, e.g., $N_2$ is introduced into the reaction furnace 1 at the same time. At that time, the temperature in the reaction furnace 1 is set to 600° C.

Next, the boat 9 is moved upward by the boat elevator 15, and the boat 9 is loaded into the reaction furnace 1 (Boat Load) whose temperature is set to 600° C. After the boat 9 is loaded into the reaction furnace 1, the reaction furnace 1 is evacuated slowly (Slow Pump) by the exhaust apparatus 8 through the slow exhaust line. When the pressure in the reaction furnace 1 is lowered to a predetermined pressure, the APC valve is opened, the reaction furnace 1 is evacuated by the exhaust apparatus 8 through the main exhaust line 31, and the pressure in the reaction furnace 1 reaches a predetermined pressure.

The temperature in the reaction furnace 1 is increased from 600° C. to 730° C. to 800° C., e.g., to the film forming temperature of 760° C. (Ramp Up), and when the wafer temperature reaches the film forming temperature and is stabilized (Pre Heat), reaction gas is introduced into the reaction furnace 1 from the gas introducing line 6 and 7, and films are formed on the wafers 10 (Depo). For example, when an $Si_3N_4$ film (nitride silicon film, Sin hereinafter) is to be formed on the wafer 10, gas such as DCS (dichlor silane ($SiH_2Cl_2$)) and $NH_3$ is used. In this case, the temperature in the reaction furnace 1 is maintained at the film forming temperature of 730° C. to 800° C.

After the film forming processing is completed, gas is exhausted from the reaction furnace 1 while introducing inert gas (e.g., $N_2$) into the reaction furnace 1, thereby carrying out gas purging in the reaction furnace 1, and residual gas is purged (Purge). Thereafter, the main valve is closed, the introduction of the inert gas is maintained, and the pressure in the reaction furnace 1 is returned to the atmospheric pressure (Back Fill). Then, the wafers 11 formed with films supported by the boat 9 are lowered by the boat elevator from the reaction furnace 1, and are unloaded into the substrate transfer chamber 11 (Boat Down).

The temperature in the furnace is lowered from 760° C. to 700° C. before the boat 9 is unloaded for increasing the unloading speed of the boat. If the temperature in the reaction furnace 1 when the boat is unloaded is lower than the film forming temperature (760° C.), a temperature difference or variation over the entire surface of a wafer when the boat is unloaded can be reduced, and a flexure amount of a wafer can be reduced. In such a state, the boat can be moved down swiftly without affecting the wafer. The temperature is slightly lowered also for moderating thermal influence on peripheral members when the boat is unloaded.

After the boat is unloaded, an opening of the reaction furnace (boat in/out opening), the opening of the furnace opening flange 2 is closed air-tightly with the furnace opening gate valve 13 (see FIG. 2). Then, wafers 10 after the films are formed are cooled in the substrate transfer chamber 11 (Wafer Cool). The cooling operation of the wafers 10 in the substrate transfer chamber 11 is completed, the wafers 10 are discharged from the boat 9 by a substrate transfer device (not shown) (W/F Discharge)

Together with the cooling operation of the wafers 10 (Wafer Cool) and the discharging operation of the wafers (W/F Discharge), gas purging is carried out using inert gas in a state where the air-tightly closed reaction furnace 1 is brought into the atmospheric pressure. For example, $N_2$ purging is carried out. When purging is carried out, it is preferable that while supplying $N_2$ of large flow rate of 20 L/min or more into the reaction furnace 1, gas is exhausted through the high flow vent line 32 which is branched off from the main exhaust line 31. In this case, the valve 35 is opened, and the main valve is closed.

Simultaneously with the purging in the furnace in the atmospheric pressure state, the temperature in the reaction furnace 1 is reduced at greater temperature lowering rate than the temperature lowering rate (≈3° C./min) at the time of natural cooling operation by the forcibly cooling mechanism 40, and the temperature in the furnace is abruptly varied. With this, stress of the deposited film adhered to the reaction furnace 1 is increased as compared with the natural cooling operation to positively generate the thermal stress, and a cracking more than the natural cooling operation is forcibly generated in the deposited film. Fine particles scattered when the cracking is generated are forcibly and efficiently discharged out from the reaction furnace by the purging in the furnace in the atmospheric pressure state. When the temperature in the furnace is lowered by the forcibly cooling mechanism 40, the shutters 46 and 47 are opened, atmospheric gas of high temperature in the thermal insulation cover 41 is exhausted by the exhaust blower 49, and cooling medium such as air and $N_2$ is introduced into the thermal insulation cover 41 by the introduction blower 45.

It is preferable that the temperature lowering rate is at least 10° C./min or more, and more preferable 20° C./min or more. Concerning the temperature reduction in the furnace, the temperature in the reaction furnace 1 is lowered to about ½ (50%) or lower of at least the film forming temperature. That is, the temperature lowering width (amount) is set to about ½ (50%) or more of at least the film forming temperature. For example, when the film forming temperature is about 730 to 800° C., the temperature in the reaction furnace 1 is lowered from 800° C. to 400° C.

Before the temperature in the reaction furnace 1 is lowered, the temperature in the reaction furnace 1 is once increased higher than the film forming temperature and then, the temperature may be reduced lower than the film forming temperature. In the case of FIG. 3, after the boat is moved down, the temperature in the reaction furnace 1 is once increased higher than the temperature in the furnace (700° C.) when the boat is moved down and increased to 800° C. which is higher than the film forming temperature (760° C.) at the temperature increasing rate of 40° C./min and then, the temperature in the furnace is reduced to 400° C. which is lower than the film forming temperature at the temperature lowering rate of 20° C./min. If the temperature in the furnace is once increased before it is lowered in this manner, the temperature lowering width (temperature difference) can be increased without lowering the temperature of the temperature-lowering end so much and thus, the temperature increasing time after the temperature is lowered can be shortened.

The temperature in the furnace is increased before the temperature is lowered so as to increase the temperature difference (temperature lowering width) without reducing the temperature-lowering end so much. This operation can be omitted but in such a case, the temperature difference (temperature lowering width) is reduced, and the particle-reducing effect is deteriorated. To prevent the particle-reducing effect from being deteriorated, it is necessary to lower the temperature of the temperature lowering end to increase the temperature difference (temperature lowering width), but in such a case, the temperature increasing time after the temperature is lowered is increased, and the throughput is deteriorated.

Also when the temperature is increased before the temperature in the furnace is lowered, the temperature in the furnace is abruptly varied. Therefore, it is conceived that cracking to some extent is generated in the deposited film which is adhered to the furnace. However, according to the theoretical calculation, it is conceived that stress difference between quartz (furnace wall) and the deposited film is increased when the temperature in the furnace is lowered, and cracking is more prone to be generated.

As an experiment, purging was carried out while lowering the temperature in the furnace from 800° C. to 400° C. slowly without forcibly cooling (abruptly cooling) the furnace. As a result of the experiment, cracking was not generated so much in the deposited film adhered to the furnace, and the effect was insufficient. That is, it was found that sufficient effect could not be obtained only by increasing the temperature difference (temperature lowering width). To obtain sufficient effect, it is necessary to increase both (1) temperature difference (temperature lowering width) and (2) temperature lowering speed.

If the gas purging is carried out simultaneously with the forced cooling in the furnace using inert gas in the reaction furnace 1 under the atmospheric pressure, there is a merit that the particle eliminating effect is greater as compared with the gas purging carried out under a reduced pressure. This is because that the number of molecules and the number of atoms which carry foreign matters under the atmospheric pressure are greater as compared with those under the reduced pressure, and energy for carrying foreign matters is greater.

If $N_2$ molecules are exhausted by a vacuum pump such as a turbo molecule pump or the like, since the $N_2$ molecules are roughly exist in the gas flow and average free path of the $N_2$ molecule is large, even if the flow speed of $N_2$ molecule is increased, it is difficult to discharge particles as molecule flow. This is because that the probability that Brownian moving particles by heat do not collide against the $N_2$ molecules and drop by gravitation is high.

In the case of exhausting operation under the atmospheric pressure, although the gas flow speed becomes as slow as about 10 cm/min, since $N_2$ molecules finely exist in the gas flow and collide against particles, it is easy to exhaust the particles. This is because that wind of $N_2$ gas blows from introducing side toward exhausting side in the furnace, and the wind blows off the particles out from the furnace.

For comparison, gas purging was carried out in a furnace under a reduced pressure and under the atmospheric pressure as experiments, and it was found that the particle eliminating effect of gas purging under the atmospheric pressure is much more excellent as compared with gas purging under the reduced pressure.

In the case of purging under the reduced pressure, a step for returning the pressure in the furnace to the atmospheric pressure after the purging is required and time loss is generated. In the case of purging under the atmospheric pressure, there is a merit that such a step is unnecessary and the purging time can be shortened.

In the case of the purging under the reduced pressure, by-product which is adhered to an exhaust system or periphery thereof sublimes and flows backward into the furnace in some cases, but in the case of the purging under the atmospheric pressure, such a problem is not caused.

When the interior of the furnace is only cooled forcibly and purging is not carried out, generated particles drop onto the furnace opening gate valve 13. Particles which drop to the furnace opening gate valve 13 are retracted to an evacuation position 14 in a state where the particles are held on the furnace opening gate valve 13 when next films are formed. That is, next films are to be formed, it is possible to create a state where no particles exist in the furnace so that particles do not affect the next film forming operation. The furnace opening gate valve 13 is provided at its upper surface with grooves (recesses), and the dropped particles can be accommodated in the grooves. Therefore, when the furnace opening gate valve 13 is to be moved to the evacuation position 14, the particles can be prevented from dropping. The evacuation position 14 may be provided with a particle removing mechanism (sucking means or the like), and particles on the furnace opening gate valve may be removed while the furnace opening gate valve 13 is retracted.

In a state where wafers 10 are unloaded from the reaction furnace 1 and the reaction furnace 1 is air-tightly closed, the temperature in the reaction furnace 1 is lowered to about half of the film forming temperature at a temperature lowering rate of at least 10° C./min or more, more preferably 20° C./min or more and in this state, inert gas is purged. This series of operations is carried out while controlling the heater 5, the forcibly cooling apparatus 40, the gas supply system, the exhaust system and the like by the control means 20. The purging in the furnace is called a low temperature purging (LTP).

A preferable temperature increasing rate when the temperature is to be increased before the temperature in the furnace is lowered in the LTP is 3° C./min or more, preferably 10 to 100° C./min, and more preferably 30 to 100° C./min. A preferable temperature lowering rate when the temperature in the furnace is to be lowered is 3° C./min or more, preferably 10 to 100° C./min, and more preferably 20 to 100° C./min.

When the discharging operation of the wafers 10 from the boat 9 in the substrate transfer chamber 11 is completed, a desired number of next wafers 10 are charged into the boat 9 by the substrate transfer device (Wafer charge). At the same time, the temperature in the furnace is increased to a standby temperature, e.g., 600° C. If the wafers 10 are charged into the boat 9, the boat 9 is moved upward by the boat elevator 15, the boat 9 is loaded into the reaction furnace 1 (Boat Load), and the next batch processing is continued.

A reason why the temperature in the furnace is increased from 400° C. to 600° C. before the boat is loaded after the LTP is that the temperature in the furnace increasing time after the boat is loaded in next film forming operation is shortened, and total film forming time is shortened. If the temperature in the furnace is held at 400° C. which is the temperature lowering end of the LTP after the LTP, it is necessary to load the boat at 400° C. at the next film forming operation and to increase the temperature in the furnace from 400° C. to 760° C. (by 360° C.), and the temperature increasing time is increased. If the temperature in the furnace is increased to 600° C. after the LTP, the boat can be loaded at 600° C. at the next film forming operation and then, the temperature in the furnace may be increased from 600° C. to 760° C. (by 160° C.), and the temperature increasing time can be shortened. If the temperature in the furnace when the boat is to be loaded is excessively high, the wafer may be warped. The temperature in the furnace is set to 600° C. while taking this problem into consideration.

In the water processing, in a state where the reaction furnace 1 is air-tightly closed after the boat is unloaded (in a state where there is no wafer 10 in the reaction furnace 1), $N_2$ is purged from the reaction furnace 1 under the atmospheric pressure and in this state, air is exhausted under the atmospheric pressure. At the same time, the temperature in the furnace is lowered (reduced) from 800° C. to 400° C. by the forcibly cooling mechanism 40 at a temperature lowering rate of 20° C./min or more. By lowering the temperature in this manner, stress of the reaction by-product deposited film adhered to an inner surface of the reaction furnace 1 is increased as compared with a case of natural air cooling (temperature lowering rate 3° C./min), the thermal stress is positively generated, and cracking greater than that of the natural cooling is forcibly generated in the deposited film. By purging gas from the reaction furnace 1 under the atmospheric pressure, fine particles scattered by the generated cracking are forcibly and efficiently discharged out from the reaction furnace 1.

The temperature in the furnace when films are formed is higher than the temperature lowering end temperature (400° C.) in the LTP by several hundred degrees, and stress of a deposited film whose temperature was once lowered (400° C.) is moderated. Therefore, new cracking is prevented from being generated when SiN films of next batch processing are to be formed. It is found that if the temperature is increased, stress of the deposited film is reduced, and since the stress of the deposited film is reduced when films are to be formed, the possibility that a new cracking is generated when films are formed is further reduced.

Cracking is previously generated in a deposited film, and fine particles generated when the cracking is generated is forcibly discharged out from the reaction furnace 1 before a boat is loaded. Therefore, wafers are processed in a state where there are no fine particles. Since particles which are generated by the cracking in the deposited film can efficiently be removed, the reaction furnace 1 may be cleaned before the deposited film is peeled. According to the present invention, time period during which a deposited film is peeled can largely be increased. Therefore, it is possible to largely increase the time interval between cleaning periods of the reaction furnace 1 (time elapsed before thickness of a deposited film becomes 25 μm).

Since the coefficients of thermal expansion of SiC and SiN are close to each other, large stress difference is not generated so much between SiC and SiN. Therefore, when a reaction tube such as the outer tube 3 and the inner tube 4 is made of SiC, excellent effect of the LTP can not be expected so much. Since the coefficients of thermal expansion of $SiO_2$ (quartz) and SiN are largely different from each other, a stress difference therebetween is large. That is, the LTP is especially effective when a reaction tube made of quartz is used and SiN films are formed.

FIRST EXAMPLE

Next, an experiment carried out for finding out a relation between a temperature lowering width in the LTP and generated particles will be explained below as a first example.

Using the wafer processing method in the above embodiment, SiN films, especially $Si_3N_4$ films whose film thickness of one film-formation was 1500 Å or higher were formed on silicon wafers of φ300 mm. DCS ($SiH_2Cl_2$) and $NH_3$ were used as reaction gases and the film forming temperature was 730° C. to 800° C. The temperature lowering rate in the LTP was 20° C./min. The processing was carried out while varying the temperature lowering width between three values, i.e., 300° C., 400° C. and 800° C., and the number of particles after the processing in each case was measured.

Figure 4:
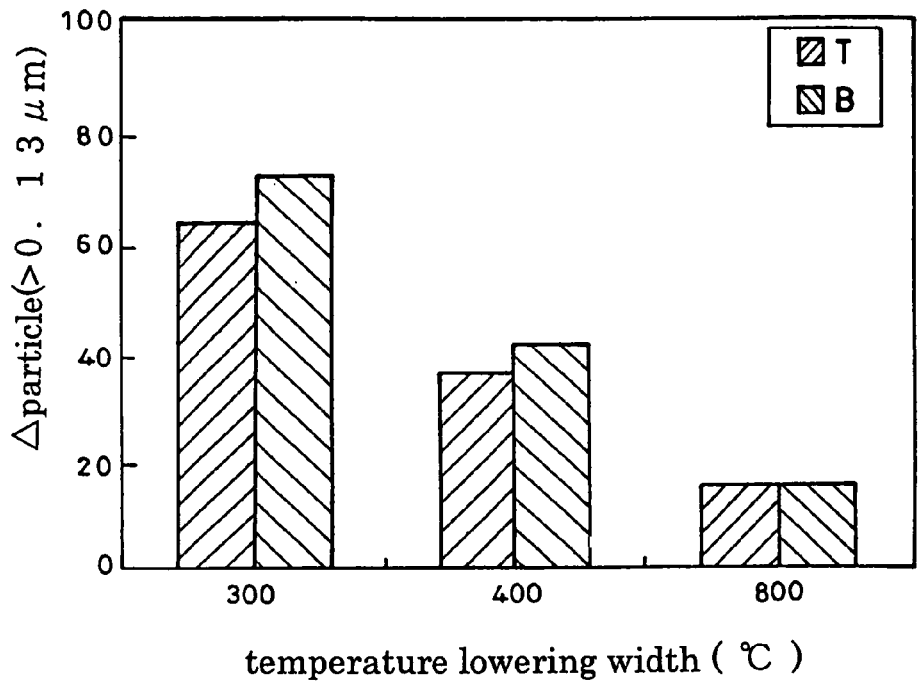
FIG. 4 is a diagram showing a relationship between a temperature lowering width at the time of a LTP operation according to a first example of the present invention and particles.

FIG. 4 shows a result of the measurement (relation between particles and the temperature lowering width in the LTP). A horizontal axis shows the temperature lowering width (° C.) in the LTP, and a vertical axis shows the number of particles (the number of particles/wafer) which are adhered to a wafer and which is 0.13 μm or greater. In FIG. 4, T represents a top wafer and B represents a bottom wafer. From FIG. 4, it can be found that the number of particles is about 60 to 70 when the temperature lowering width is 300° C., and the number of particles is 40 or less when the temperature lowering width is 400° C. That is, if the temperature lowering width is 400° C. (about 50% of film forming temperature) when the film forming temperature is 730° C. to 800° C., the particles can largely be reduced (at least 40 particles or less).

SECOND EXAMPLE

Next, an experiment carried out for finding out a relation between a temperature lowering width in the LTP and generated particles will be explained below as a second example.

According to the wafer processing method of the above example, SiN films, especially $Si_3N_4$ films whose film thickness of one film-formation was 1500 Å or higher were formed on silicon wafers of φ300 mm. DCS ($SiH_2Cl_2$) and $NH_3$ were used as reaction gases and the film forming temperature was 730° C. to 800° C. The temperature lowering width in the LTP was 400° C. The processing was carried out while varying the temperature lowering rate between three values, i.e., 0° C./min, 4° C./min and 20° C./min, and the number of particles after the processing in each case was measured.

Figure 5:
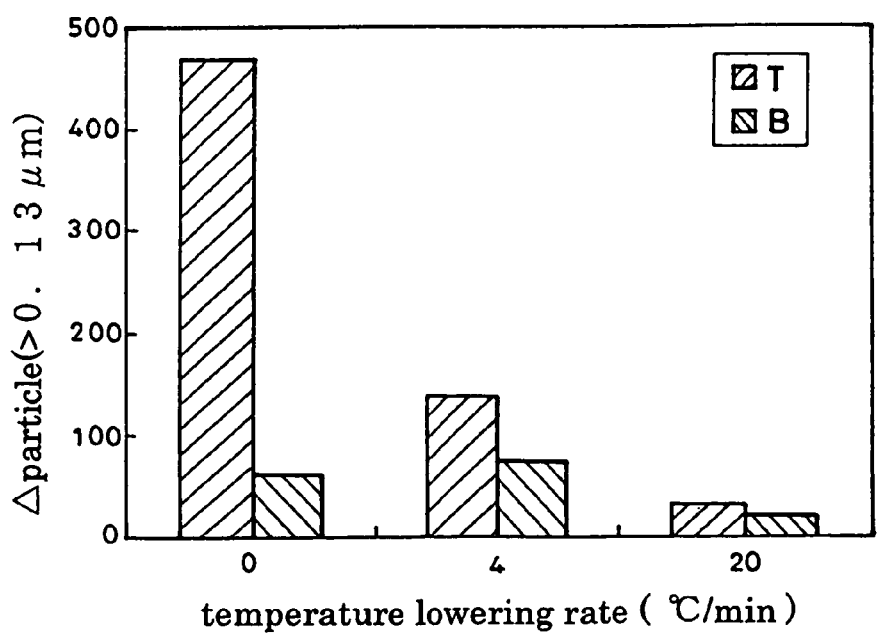
FIG. 5 is a diagram showing a relationship between a temperature lowering rate at the time of a LTP operation according to a second example of the present invention and particles.

FIG. 5 shows a result of the measurement (relation between particles and the temperature lowering rate in the LTP). A horizontal axis shows the temperature lowering rate (° C./min) in the LTP, and a vertical axis shows the number of particles (the number of particles/wafer) which are adhered to a wafer and which is 0.13 μm or greater. In FIG. 5, T represents a top wafer and B represents a bottom wafer. In FIG. 5, when the temperature lowering rate is set to 0° C./min (i.e., when the temperature is not lowered), the number of particles of the top wafer is about 460, and the number of particles of the bottom water is about 60. When the temperature lowering rate is set to 4° C./min, the number of particles of the top wafer is about 100 or more, and the number of particles of the bottom water is about 70. When the temperature lowering rate is set to 20° C./min, the number of particles of the top wafer and the number of particles of the bottom water are both 30 or less. That is, if the temperature lowering rate in the LTP is set to 20° C./min or higher, the number of particles can largely be reduced (at least 30 or less). As a result of another experiment, it could be checked that if the temperature lowering rate was set to at least 10° C./min or higher, the number of particles could largely be reduced as compared with the natural cooling.

THIRD EXAMPLE

Next, an experiment carried out for finding out a relation between particles and accumulated film thickness at the time of the LTP will be explained below as a third example.

According to the wafer processing method of the above example, SiN films, especially $Si_3N_4$ films whose film thickness of one film-formation was 1500 Å (150 nm) or higher were formed on silicon wafers of ϕ300 mm. DCS ($SiH_2Cl_2$) and $NH_3$ were used as reaction gases and the film forming temperature was 730° C. to 800° C. The temperature lowering width in the LTP was 400° C., and the temperature lowering rate was 20° C./min. Wafer cooling time was 15 minutes and wafer collecting time was 15 minutes. Therefore, the LTP was carried out simultaneously with these events within this total time (30 minutes) so that throughput is not lowered. In this example, the total time of the LTP was 30 minutes (temperature increasing time before the temperature is lowered was 10 minutes and the temperature lowering time was 20 minutes). Under such conditions, wafers were subjected to continuous batch processing, and after the batch processing, the number of particles adhered to the wafer was measured.

Figure 6:
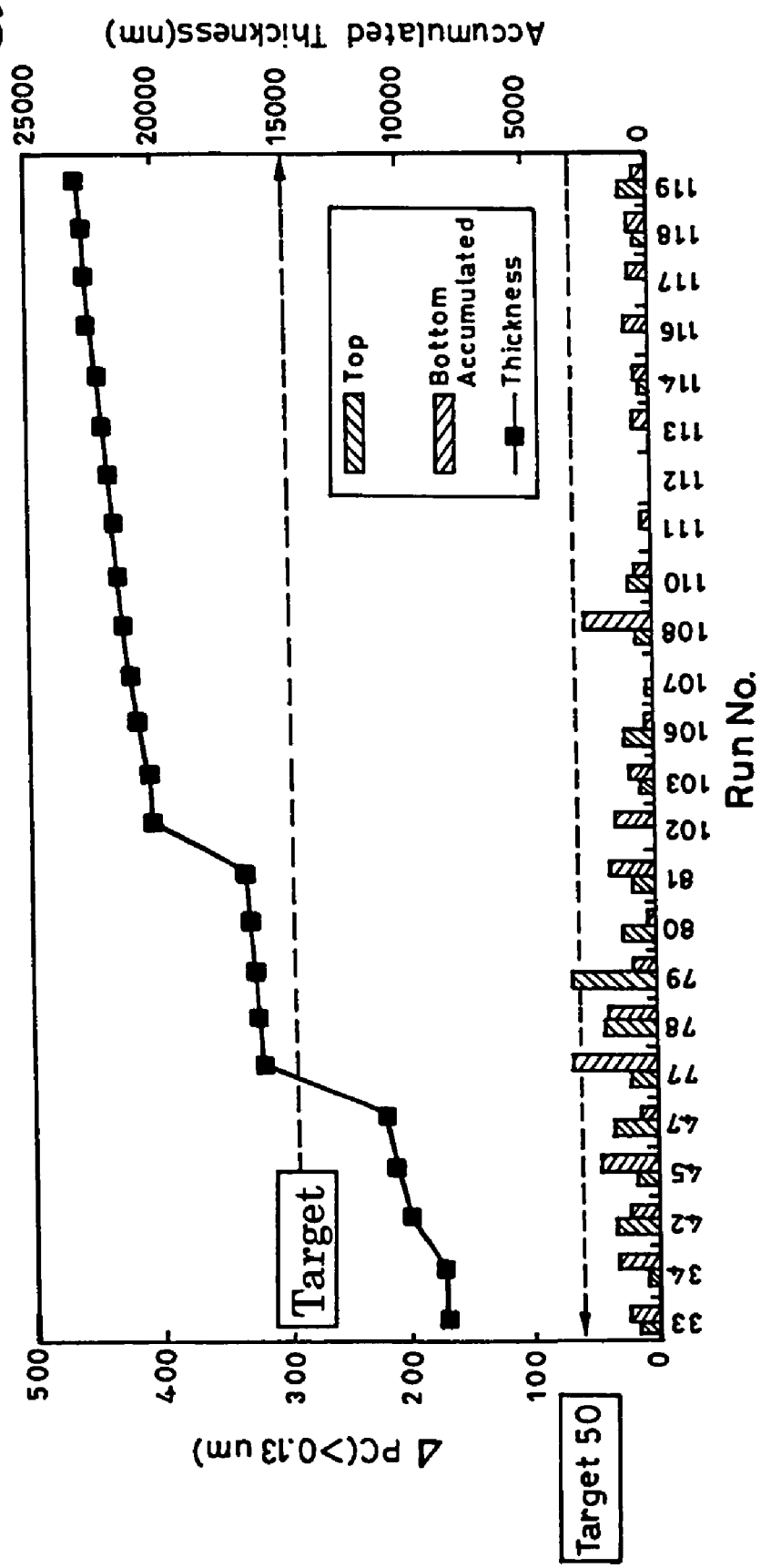
FIG. 6 is a diagram showing a relationship between a accumulated film thickness at the time of a LTP operation according to a third example of the present invention and particles.

FIG. 6 shows a result of the measurement (a relation between particles and accumulated film thickness). A horizontal axis shows the number of continuous batch processing (Run No.), a left vertical axis shows the number of particles which adheres to the wafer (the number of particles/wafer), and a right vertical axis shows accumulated film thickness (nm). In FIG. 6, TOP represents a top wafer and BOTTOM represents a bottom wafer. A bar graph shows the number of particles, and a line graph shows accumulated film thickness. From FIG. 6, it can be found that the number of particles is about 50 or less until Run No. 119 (119th batch processing) was carried out, i.e., until the accumulated film thickness became 23 μm (23000 nm). The present inventors performed an experiment and could check that the number of particles became 50 or less even if the accumulated film thickness exceeded 25 μm (25000 nm).

When the present invention is not carried out, if the accumulated (cumulative) film thickness exceeds 1 μm (1000 nm), the number of particles is abruptly increased and largely exceeds 200. If the present invention is carried out, however, the number of particles becomes 50 or less even if the accumulated film thickness exceeded 25 μm (25000 nm). In the case of this example, the film thickness accumulated during one batch processing is 0.15 μm (150 nm). Therefore, in the conventional technique, to make it possible to form films while suppressing the number of particles to 50 or less, the continuous batch processing can be carried out only about seven times. If the present invention is carried out, however, the continuous batch processing can be carried out about 167 times. That is, the time interval between the cleaning time periods of the reaction furnace can largely be increased, and the cleaning frequencies of the reaction furnace can largely be reduced.

The entire disclosure of Japanese Patent Application No. 2003-327358 filed on Sep. 19, 2003 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

INDUSTRIAL APPLICABILITY

As explained above, according to the preferred embodiment of the present invention, cracking is forcibly generated in a deposited film produced in the reaction furnace before films are formed, and fine particles produced when the cracking is generated are discharged out. Therefore, it is possible to restrain fine particles from being generated when films are formed, and films of high quality can be formed. Since the cleaning operation of the reaction furnace may be carried out before the deposited film is peeled, there are excellent effects that time interval between the cleaning time periods is increased, maintenance performance is enhanced, an availability factor is enhanced, and the processing time is not increased as compared with the conventional technique.

As a result, the present invention can preferably be utilized for a producing method of a semiconductor device having a film forming step using the CVD and for a substrate processing apparatus which can preferably carry out the film forming step.

The invention claimed is:

1. A producing method of a semiconductor device, comprising:
    loading a substrate into a reaction furnace;
    forming a film on the substrate in the reaction furnace;
    unloading the substrate from the reaction furnace after the film has been formed; and
    purging an interior of the reaction furnace by flowing purge gas in the interior of the reaction furnace simultaneously with forcibly cooling the interior of the reaction furnace by flowing a cooling medium in a space between a thermal insulation cover provided covering the reaction furnace and the reaction furnace, after the substrate has been unloaded from the reaction furnace and in a state where the substrate does not exist in the reaction furnace,
    wherein the purging of the interior of the reaction furnace includes exhausting atmospheric gas of high temperature in the space between the thermal insulating cover and the reaction furnace simultaneously with flowing the cooling medium in the space between the thermal insulating cover and the reaction furnace.

2. A producing method of a semiconductor device, comprising:
    loading a substrate into a reaction furnace;
    forming a film on the substrate in the reaction furnace;
    unloading the substrate from the reaction furnace after the film has been formed;
    purging an interior of the reaction furnace by flowing purge gas in the interior of the reaction furnace simultaneously with forcibly cooling the interior of the reaction furnace by flowing a cooling medium in a space between a thermal insulation cover provided covering the reaction furnace and the reaction furnace, after the substrate has been unloaded from the reaction furnace and in a state where the substrate does not exist in the reaction furnace; and
    gas-cleaning the interior of the reaction furnace after repeating each of the above,
    wherein the purging of the interior of the reaction furnace includes exhausting atmospheric gas of high temperature in the space between the thermal insulating cover and the reaction furnace simultaneously with flowing the cooling medium in the space between the thermal insulating cover and the reaction furnace.

3. A producing method of a semiconductor device, comprising:
    loading a substrate into a reaction furnace;
    forming a film on the substrate in the reaction furnace;
    unloading the substrate from the reaction furnace after the film has been formed; and
    purging an interior of the reaction furnace by flowing purge gas in the interior of the reaction furnace simultaneously with forcibly cooling the interior of the reaction furnace by flowing a cooling medium in a space between a thermal insulation cover provided covering the reaction furnace and the reaction furnace, after the substrate has been unloaded from the reaction furnace and in a state where the substrate does not exist in the reaction furnace.

wherein the substrate loading into the reaction furnace, the film thrilling on the substrate and the substrate unloading from the reaction furnace are carried out in a state where the substrate is supported by a support tool, and the purging of the interior of the reaction furnace is carried out simultaneously with discharging the substrate after processing from the support tool and/or charging the substrate to be processed next to the support tool; and the purging of the interior of the reaction furnace includes exhausting atmospheric gas of high temperature in the space between the thermal insulating cover and the reaction furnace simultaneously with flowing the cooling medium in the space between the thermal insulating cover and the reaction furnace.

4. A producing method of a semiconductor device, comprising:

loading a substrate into a reaction furnace;

forming a film on the substrate in the reaction furnace;

unloading the substrate from the reaction furnace after the film has been formed; and purging an interior of the reaction furnace, which is maintained in a state where at pressure in the reaction furnace is equal to the atmospheric pressure, by flowing purge gas in the interior of the reaction furnace simultaneously with forcibly cooling the interior of the reaction furnace by flowing a cooling medium in a space between a thermal insulation cover provided covering the reaction furnace and the reaction furnace, after the substrate has been unloaded from the reaction furnace and in a state where the substrate does not exist in the reaction furnace, wherein the purging of the interior of the reaction furnace includes exhausting atmospheric gas of high temperature in the space between the thermal insulating cover and the reaction furnace simultaneously with flowing the cooling medium in the space between the thermal insulating cover and the reaction furnace.

5. A producing method of a semiconductor device comprising:

loading a substrate into a reaction furnace;

forming a film on the substrate in the reaction furnace by supplying a film-forming gas to an interior of the reaction furnace and exhausting the interior of the reaction furnace using a first exhaust line;

unloading the substrate from the reaction furnace after the film has been formed; and purging the interior of the reaction furnace by supplying purge gas to the interior of the reaction furnace and exhausting the interior of the reaction furnace using a second exhaust line which is different from the first exhaust line simultaneously with forcibly cooling the interior of the reaction furnace by flowing a cooling medium in a space between a thermal insulation cover provided covering the reaction furnace and the reaction furnace, after the substrate has been unloaded from the reaction furnace and in a state where the substrate does not exist in the reaction furnace, wherein the purging of the interior of the reaction furnace includes exhausting atmospheric gas of high temperature in the space between the thermal insulating cover and the reaction furnace simultaneously with flowing the cooling medium in the space between the thermal insulating cover and the reaction furnace.

6. A producing method of a semiconductor device comprising:

loading a substrate into a reaction furnace;

forming a film on the substrate in the reaction furnace;

unloading the substrate from the reaction furnace after the film has been formed; and purging an interior of the reaction furnace by flowing purge gas in the interior of the reaction furnace simultaneously with forcibly cooling the interior of the reaction furnace by flowing a cooling medium in a space between a thermal insulation cover provided covering the reaction furnace and the reaction furnace after once increasing a temperature of the interior of the reaction furnace to a temperature higher than a film forming temperature, after the substrate has been unloaded from the reaction furnace and in a state where the substrate does not exist in the reaction furnace, wherein the purging of the interior of the reaction furnace includes exhausting atmospheric gas of high temperature in the space between the thermal insulating cover and the reaction furnace simultaneously with flowing the cooling medium in the space between the thermal insulating cover and the reaction furnace.

7. A producing method of a semiconductor device as recited in claim 1, wherein the purging of the interior of the reaction furnace includes flowing air or $N_2$ as the cooling medium in the space between the thermal insulating cover and the reaction furnace.

8. A producing method of a semiconductor device, comprising:

loading a substrate into a reaction furnace;

forming a film on the substrate in the reaction furnace;

unloading the substrate from the reaction furnace after the film has been formed; and purging an interior of the reaction furnace by flowing purge gas in the interior of the reaction furnace simultaneously with forcibly cooling the interior of the reaction furnace by flowing a cooling medium in a space between a thermal insulation cover provided covering the reaction furnace and the reaction furnace, after the substrate has been unloaded from the reaction furnace and in a state where the substrate does not exist in the reaction furnace, wherein the purging of the interior of the reaction furnace includes forcibly generating cracking in a deposited film formed in the reaction furnace by forcibly cooling the interior of the reaction furnace by flowing the cooling medium in the space between the thermal insulating cover and the reaction furnace and discharging particles generated by cracking from the reaction furnace by purging the interior of the reaction furnace.

9. A producing method of a semiconductor device as recited in claim 1, wherein in the purging of the interior of the reaction furnace, a temperature of the interior of the reaction furnace is lowered at a temperature lowering rate of equal to or more than 10° C./min.

10. A producing method of a semiconductor device as recited in claim 1, wherein in the purging of the interior of the reaction furnace, a temperature of the interior of the reaction furnace is lowered at a temperature lowering rate of equal to or more than 20° C./min.

11. A producing method of a semiconductor device as recited in claim 1, wherein in the purging of the interior of the reaction furnace, a temperature of the interior of the reaction furnace is lowered at a temperature lowering rate of equal to or more than 10° C./min and equal to or less than 100° C./min.

12. A producing method of a semiconductor device as recited in claim 1, wherein in the purging of the interior of the reaction furnace, a temperature of the interior of the reaction furnace is lowered at a temperature lowering rate of equal to or more than 20° C./min and equal to or less than 100° C./min.

13. A producing method of a semiconductor device as recited in claim 1, wherein in the purging of the interior of the reaction furnace, purge gas is supplied at a flow rate of equal to or more than 10 L/min into the reaction furnace.

14. A producing method of a semiconductor device as recited in claim 1, wherein in the purging of the interior of the reaction furnace, purge gas is supplied at a flow rate of equal to or more than 20 L/min into the reaction furnace.

15. A producing method of a semiconductor device as recited in claim 1, wherein the reaction furnace is a hot wall type reaction furnace.

16. A producing method of a semiconductor device as recited in claim 5, wherein in the purging of the interior of the reaction furnace, a pressure in the reaction furnace is maintained to atmospheric pressure.

17. A producing method of a semiconductor device as recited in claim 5, wherein the first exhaust line is in communication with a vacuum pump and the second exhaust line is in communication with an exhaust system of a building service.

* * * * *